United States Patent [19]

Dummer

[11] 4,027,127

[45] May 31, 1977

[54] ELECTRIC SWITCHES HAVING SELECTABLE AND ADJUSTABLE PRE-TRAVELS

[75] Inventor: Merlin R. Dummer, Arab, Ala.

[73] Assignee: Cutler-Hammer, Inc., Milwaukee, Wis.

[22] Filed: Nov. 21, 1975

[21] Appl. No.: 634,245

[52] U.S. Cl. .......................... 200/153 LA; 200/157
[51] Int. Cl.[2] .......................................... H10H 3/00
[58] Field of Search .............. 200/153 LA, 153 LB, 200/153 R, 153 W, 157, 77, 76, 68

[56] References Cited

UNITED STATES PATENTS

| | | | |
|---|---|---|---|
| 2,904,652 | 9/1959 | Crane et al. | 200/153 LA |
| 2,968,710 | 1/1961 | Horberg, Jr. | 200/153 LA |

*Primary Examiner*—Herman J. Hohauser
*Attorney, Agent, or Firm*—Hugh R. Rather; William A. Autio; Michael E. Taken

[57] ABSTRACT

Trigger operated snap-action switches having selectable and adjustable cam inserts in the trigger arranged for engaging the plunger of a snap-action mechanism to afford selection and adjustment of the pre-travel, and in the case of a double pole switch, to afford simultaneous or sequential closing of the contacts as desired.

20 Claims, 14 Drawing Figures

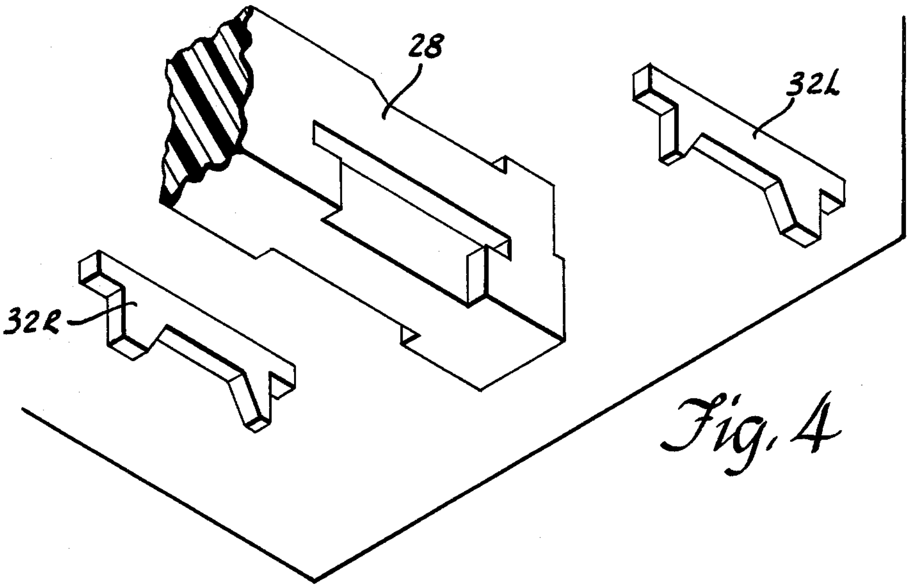
Fig. 4
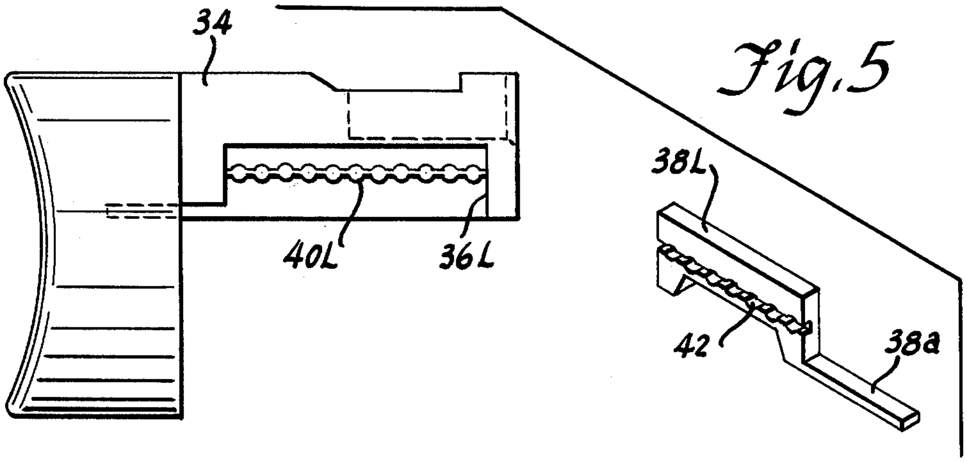
Fig. 5
Fig. 6
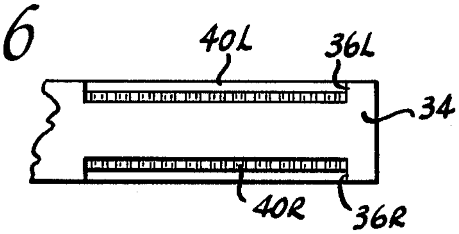
Fig. 9
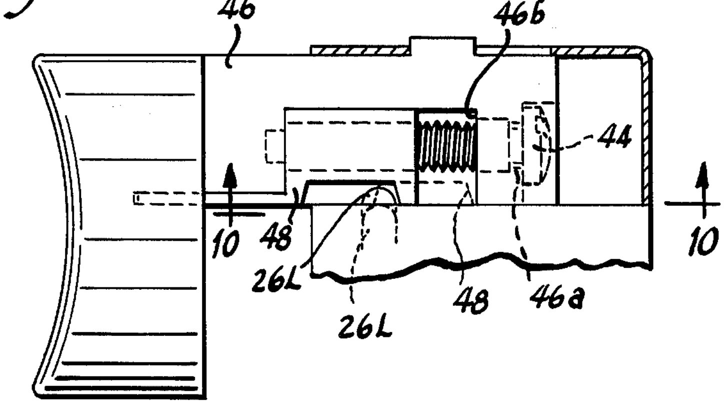

ELECTRIC SWITCHES HAVING SELECTABLE AND ADJUSTABLE PRE-TRAVELS

BACKGROUND OF THE INVENTION

Electric switches having a contact mechanism actuated by the camming action of a sliding operator are known in the prior art. The amount of pre-travel of such a prior switch, i.e., operator travel from "off" to "on" positions, is the same for all applications thereof and cannot be changed without redesigning the switch. The present invention allows the amount of pretravel to be adjusted or selected without altering the switch structure.

SUMMARY OF THE INVENTION

An object of the invention is to provide an improved switch.

Another object of the invention is to provide a switch having an adjustable amount of pre-travel.

Another object of the invention is to provide a switch having a selectable amount of pre-travel.

Another object of the invention is to provide a switch having cam inserts adjustably inserted into a switch operator and arranged for actuation of a snap-action mechanism of the switch.

Another object of the invention is to provide a switch having cam inserts selectably and interchangeable inserted into a switch operator and arranged for actuation of a snap-action mechanism of the switch.

Another object of the invention is to provide a switch of the aforementioned character capable of variously predetermined switching points with respect to operator travel without substitution or modification of any switch components.

Another object of the invention is to provide a switch of the aforementioned character which may be of the double pole type and capable of adjustable tripping of the two sets of the contacts to provide a sequential operation thereof.

Another object of the invention is to provide a switch of the aforementioned character having a higher current rating than prior switches of the same physical size.

A more specific object of the invention is to provide a tool handle trigger switch of the aforementioned character capable of replacing existing lower rated switches without any change in the existing nesting structure therefor.

These and other objects will become apparent in the following description.

BRIEF DESCRIPTION OF THE DRAWINGS

FIG. 4 is an exploded isometric view of the rear end portion of the trigger and cam inserts of FIGS. 1 and 3.

FIG. 5 is a left side elevational of an alternate embodiment of the trigger of FIG. 1 and an isometric view of an adjustable cam insert removed therefrom.

FIG. 6 is a bottom view of the rear end portion of the trigger of FIG. 5.

FIG. 9 is a partial left side elevational view of another alternate embodiment of the switch of FIG. 1 with a portion of the enclosure broken away showing an adjustable cam insert in the extreme forward position and its relation to the switch plunger during full trigger depression and full trigger release.

DESCRIPTION OF THE PREFERRED EMBODIMENT

Figure 1:
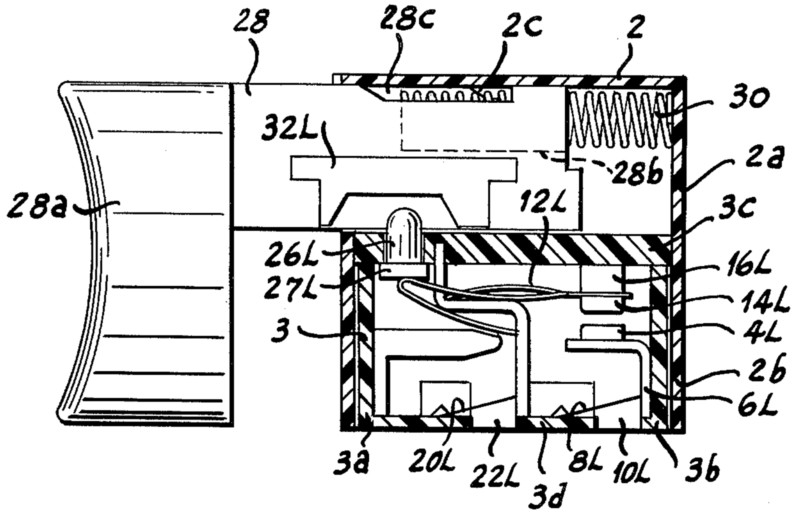
FIG. 1 is a left side cross-sectional view of a trigger operated snap-action switch constructed in accordance with the invention taken along line 1—1 of FIG. 2 showing one of the selectable cam inserts.
Figure 2:
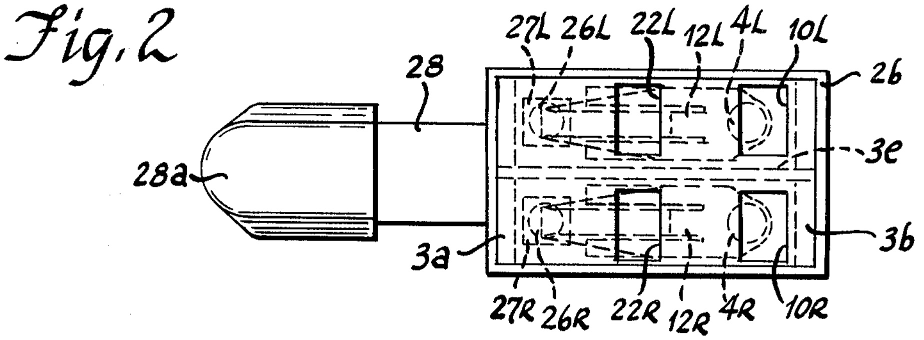
FIG. 2 is a bottom view of a switch of FIG. 1 showing the switch to be of the double pole type.
Figure 14:
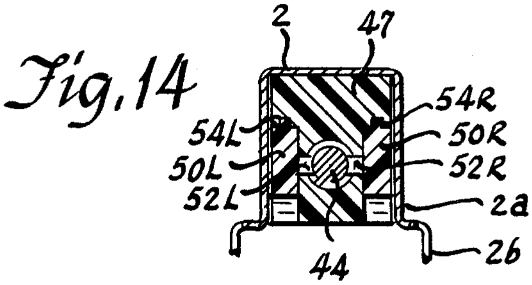
FIG. 14 is a cross-sectional view taken along line 14—14 of FIG. 12.

Referring to FIG. 1, there is shown a double-pole snap-action trigger switch constructed in accordance with the invention. As shown therein, the switch is provided with an insulating enclosure 2 having an upper portion 2*a* narrower in width than a lower portion 2*b*, as seen in FIG. 14. The upper portion 2*a* is provided with an aperture at the forward end thereof for receiving a slidable trigger 28. Enclosure 2 is open at the bottom, and lower portion 2*b* is so formed as to receive a molded base member 3 in snap-in engagement. This insulating base member is divided into left and right compartments by a central dividing wall 3*e*, shown in FIG. 2, and houses the contacts and snap-action mechanisms, as will be more fully described hereinafter. The front wall 3*a* and the rear wall 3*b* of the base member are provided with various shoulder portions, as seen in FIG. 1, which matingly fit into channels appropriately formed in lower enclosure portion 2*b*, thus assuring proper orientation of the base 3 within the lower enclosure portion 2*b* and preventing any lateral movement therebetween. The base is provided with a top wall 3*c* upon which the trigger 28 slides. This top wall has two apertures at the forward end thereof through which plungers 26L and 26R slide up and down as seen in FIGS. 1 and 2. The base is also provided with a bottom wall 3*d* having apertures 10L, 10R and 22L, 22R formed therein for receiving wire leads as will be more fully described hereinafter.

A left stationary contact 4L is mounted on a stationary contact terminal 6L which is rigidly secured in a slot adjacent rear wall 3*b* of the base as seen in FIG. 1. A terminal retainer 8L is mounted at one end to bottom wall 3*d* of the base in such a manner as to bias its other end and stationary contact terminal 6L into pinchingly retentive engagement about the bare end of an insulated wire (not shown) pushed therebetween from below through aperture 10L, thereby making electrical connection between said wire and said stationary contact terminal. The right pole of the switch is complementally formed.

The switch is provided with identical one-piece snap-action left and right contactors 12L and 12R one of which is described in detail in U.S. Pat. No. 3,415,962, assigned to the assignee of this invention. As shown in FIG. 1, a movable contact 14L is mounted to and forms a part of contactor 12L. This movable contact is provided for snapping engagement with stationary contact 4L to complete an electrical circuit. A stop 16L is integrally molded on the base and is provided to halt the upward movement of movable contact 14L after circuit disruption. As described in said patent, contactor 12L is mounted on a support terminal 18L, forming an electrical connection thereto. Another terminal retainer 20L is mounted at one end to bottom wall 3*d* of the base in such a manner as to bias its other end and support terminal 18L into pinchingly retentive engagement about the bare end of another insulated wire (not shown) pushed therebetween from below through aperture 22L, thereby making electrical connection between said other wire and said other wire and said support terminal. The right pole of the switch is complementally formed. The wires are connected to a power source and to the load desired to be driven, completing a circuit therethrough upon closure of the contacts.

As aforedescribed, top wall 3*c* of the base is provided with an aperture for receiving plunger 26L, which is positioned for up and down reciprocating movement within the aperture. The plunger has a lower enlarged flat portion 27L for engaging snap-action contactor 12L to cause over-center toggling thereof, as described in U.S. Pat. No. 3,415,962, and a rounded upper end for engagement by a camming surface of a cam insert upon trigger depression and release, as will be more fully described hereinafter. The aperture in the top wall 3*c* is smaller than the enlarged flat portion 27L of the plunger, and hence the top wall provides a stop therefor to halt the upward movement of the plunger. The right pole of the switch is complementally formed.

As shown in FIG. 1, there is provided a trigger 28 mounted for forward and rearward sliding movement in the upper portion of enclosure 2. This trigger has a finger-engaging portion 28*a* for sliding the trigger to its rearward position and a spring retaining groove 28*b* for receiving a return spring 30 which biases the trigger to its forward position. The trigger is also provided with a stop groove 28*c* for receiving a stop protrusion 2*c* formed on the inside surface of the top wall of enclosure 2, said stop protrusion limiting the forward movement of said trigger under the bias of spring 30 upon release of said trigger.

Figure 3:
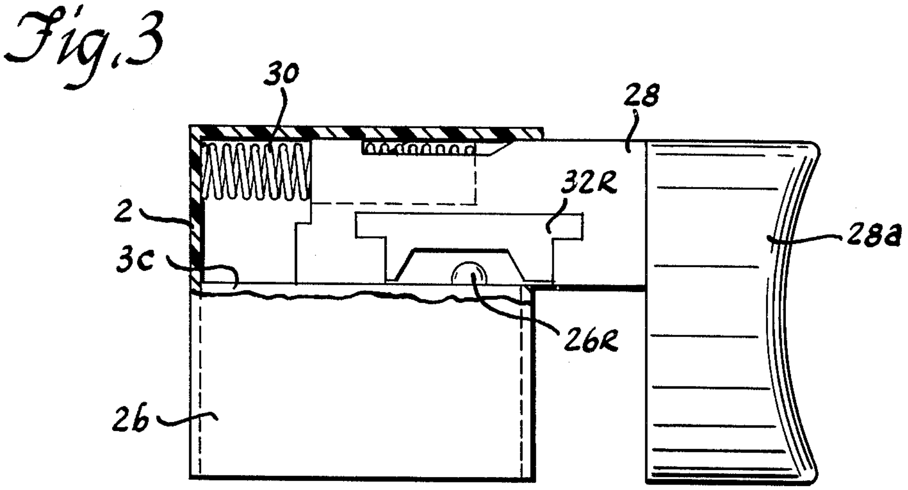
FIG. 3 is a right side elevational view of the switch of FIG. 1 with a portion of the enclosure broken away to show the other selectable cam insert.

Left and right identical indentations are formed in the trigger for receiving left and right cam inserts 32L and 32R as shown in FIG. 4. These cam inserts are rigidly held in place by the shouldered configuration of said indentations and the side wall of enclosure 2 fitting flushly thereagainst. As shown in FIGS. 1 and 3, each of these cam inserts has a central flat portion allowing maximum upward extension of the respective plunger under the bias of the corresponding snap-action contactor, and two inclined camming surfaces causing downward movement of the plunger during trigger depression and release. As shown in FIG. 4, these cam inserts are interchangeable with any other cam inserts having the same outer configuration to fit said indentations in the trigger, though not necessarily the same inner configuration with respect to the positioning of the camming surface therein. Hence, by proper choice of camming surface arrangement, characteristics such as switching pre-travel of the trigger may be varied by selective substitution of an alternative cam insert.

FIGS. 1 and 3 demonstrate another feature of the invention obtainable with selectably interchangeable camming inserts, namely, sequential operation. It is to be noted that upon trigger depression plunger 26R will be cammed downward prior to the downward camming of plunger 26L, hence contacts 4R and 14R will close sooner than contacts 4L and 14L thus allowing, for example, a "soft start," wherein only partial power is delivered to a motor upon closure of a first set of contacts prior to full power operation upon closure of a second set of contacts, so as not to subject a motor to the strain of immediate fully torqued operation. The time lag in such sequential operation may be varied according to choice of camming surface design and arrangement.

The invention also encompases cam inserts which are not only selectively interchangeable but also adjustable. As shown in FIGS. 5 to 8, there may be provided a trigger 34 having indentations 36L and 36R for receiving adjustable cam inserts 38L and 38R. Molded on the trigger within each of said indentations are ribbed support members 40L and 40R a portion of which matingly fit into a complementary groove 42 in each of the cam inserts. As shown in FIG. 5, support member 40L has more equally spaced ribs than may be mated with groove 42, hence permitting various positionings of cam insert 38L within indentation 36L. The right side components are complementary.

Figure 7:
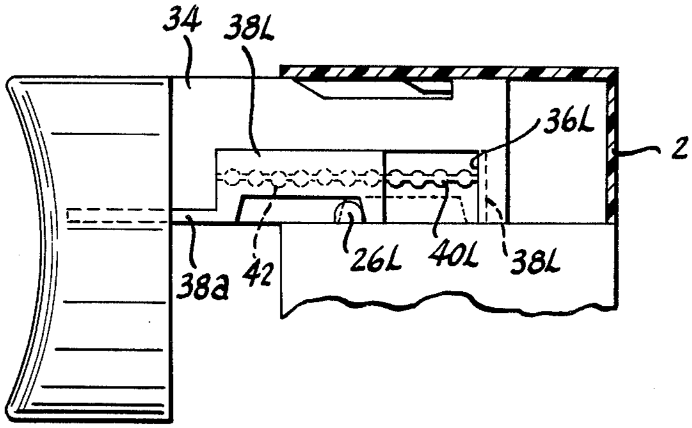
FIG. 7 is a left side elevational assembled view of the trigger of FIG. 5 with a portion of the enclosure broken away showing extreme forward insertion of the cam and its relation to the switch plunger during full trigger depression and full trigger release.
Figure 8:
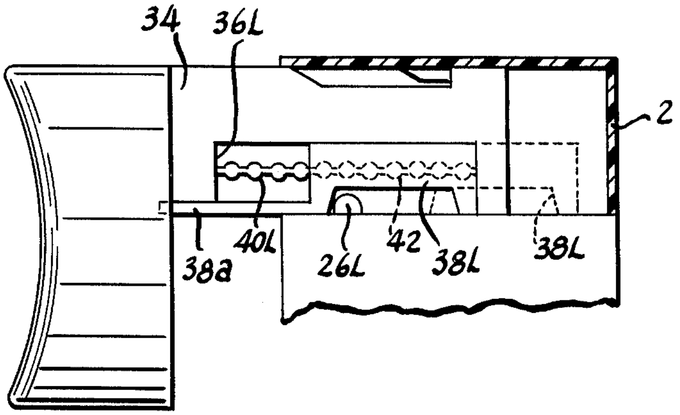
FIG. 8 is a view like FIG. 7 but showing extreme rearward insertion of the cam.

FIG. 7 shows full trigger release and full trigger depression (in broken line) when the cam insert 38L is inserted in the extreme forward position in the indentation 36L. FIG. 8 shows full trigger release and full trigger depression (in broken line) when the cam insert is inserted in the extreme rearward position in the indentation. FIG. 7 demonstrates a switch with maximum pre-travel and FIG. 8 demonstrates the same switch with minimum pre-travel. As seen in FIG. 8, the forwardly extending portion 38*a* of the cam insert is necessary to prevent the plunger from extending into indentation 36L during trigger depression. It can now be appreciated that the cam inserts depicted in FIGS. 5–8 are not only interchangeable with others having different cam contours but also adjustable with respect to the trigger, and further, the left and right cam inserts are adjustable independently of each other, thus allowing sequential operation.

Figure 11:
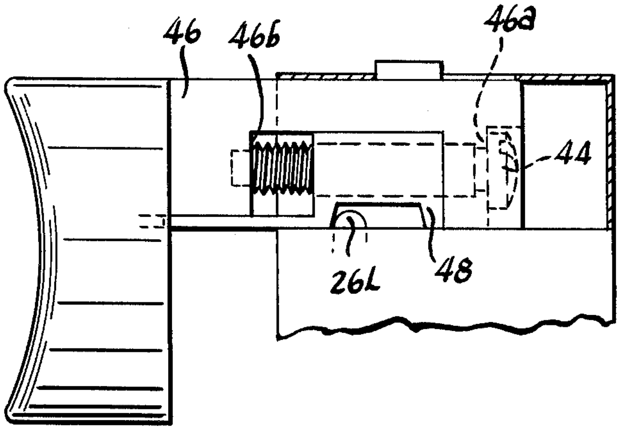
FIG. 11 is a view like FIG. 9 but showing extreme rearward positioning of the cam insert.
Figure 10:
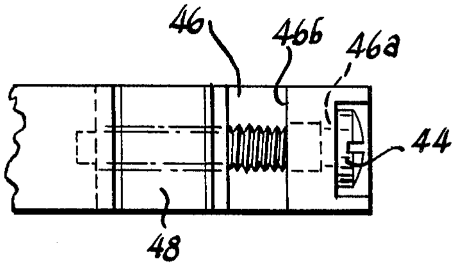
FIG. 10 is a bottom view of the trigger taken along line 10—10 of FIG. 9.

Another embodiment of the invention is depicted in FIGS. 9–11, wherein the former left and right cam inserts are now one integral piece, adjustable relative to the trigger by means of adjusting screw 44. As shown in FIG. 9, screw 44 is held on trigger 46 by shoulder portion 46*a* allowing rotation but preventing axial motion therebetween. A slot 46*b* is formed in the trigger for receiving cam insert 48 which is threadingly mounted on screw 44. The cam insert has a camming portion thereacross as shown in FIG. 10 for engaging left and right plungers 26L and 26R, said cam insert being adjustable between forward and rearward positions within slot 46*b* upon turning of screw 44. FIG. 9 depicts full trigger release and full trigger depression (in broken line) when cam insert 48 is in the extreme forward position, and FIG. 11 depicts full trigger release when the cam insert 48 is in the extreme rearward position, thus illustrating various trigger pre-travels determined by adjusting screw 44.

Figure 12:
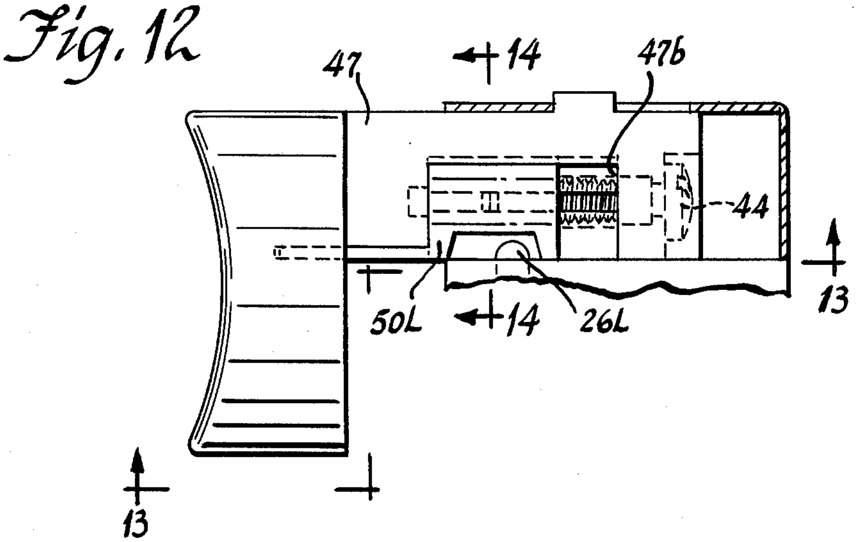
FIG. 12 is a partial left side elevational view of another alternate embodiment of the switch of FIG. 1 with a portion of the enclosure broken away to show one of a pair of adjustable cam inserts.
Figure 13:
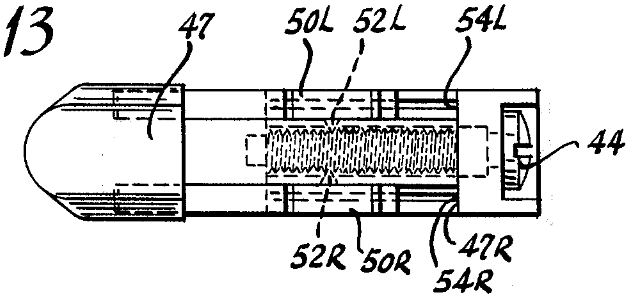
FIG. 13 is a bottom view of the trigger taken along line 13—13 of FIG. 12.

Another embodiment of the invention is depicted in FIGS. 12–14, which is similar to that depicted in FIGS. 9–11, except that the single cam insert is now separate left and right cam inserts 50L and 50R having pointed nibs 52L and 52R for engaging the threads of adjusting screw 44. Slot 47*b* has grooves 54L and 54R, FIG. 14, formed at the top therein to act as guides for upper ridges of cam inserts 50L and 50R during movement caused by the turning of screw 44. The positions of cam inserts 50L and 50R are fixed relative to each other, but movable relative to the trigger 47, thus enabling adjustment of the point of contact tripping trigger depression and release.

It will be appreciated that, aside from the features of selectable interchangeability and adjustability, the cam inserts of the invention may be provided with a variety of camming surface designs, arrangements, and inclinations all within the scope of the present invention to achieve a predetermined point of contact tripping during trigger movement and/or a predetermined sequential operation of the contacts in the case of a double pole switch.

It will also be appreciated that while a trigger switch is shown, any toggle or button could move the sliding cam inserts.

I claim:

1. In an electric switch having a contact mechanism actuated by the camming action of a sliding operator, the improvement comprising a cam insert rigidly mounted in a recessed cavity in the operator and having camming surfaces for determining the actuating point of the contact mechanism relative to operator travel.

2. The improvement according to claim 1 further comprising coupling means adjustably mounting said cam insert to the operator for varying the position of said cam insert relative to the operator.

3. The improvement according to claim 2 wherein said coupling means comprises ribbed mating detent means formed on said cam insert and the operator.

4. The improvement according to claim 2 wherein said coupling means comprises a rotatable journaled shaft communicating with the operator an said cam insert and having a threaded segment for varying the relative positions thereof upon rotation of said shaft.

5. In a multi-pole electric switch having contact mechanisms actuated by the camming action of a sliding operator, the improvement comprising a plurality of selectable cam inserts, one for each contact mechanism, rigidly mounted in respective recessed cavities in the operator, each cam insert having selectably oriented camming surface for determining the actuating point of a respective contact mechanism relative to operation travel.

6. The improvement according to claim 5 wherein said cam inserts are independently mounted to the operator whereby to afford sequential actuation of said contact mechanisms during operator travel.

7. The improvement according to claim 5 further comprising a plurality of coupling means, one for each cam insert, adjustably mounting said cam inserts to the operator for independently varying the position of each of said cam inserts relative to the operator.

8. The improvement according to claim 7 wherein said coupling means comprises ribbed mating detent means formed on said cam insert and the operator.

9. The improvement according to claim 5 further comprises coupling means adjustably mounting said cam inserts to said operator and keeping said cam inserts fixed relative to each other.

10. The improvement according to claim 9 wherein said coupling means comprises a rotatable journaled shaft communicating with the operator and said cam inserts and having a threaded segment for varying the position of said cam inserts relative to the operator upon rotation of said shaft.

11. An electric switch comprising:

a housing;

contact means mounted in said housing and actuatable to effect switching operations;

an operator mounted to said housing for travel in a path relative thereto; and cam means rigidly mounted in a recessed cavity in said operator and having a first portion mounting said cam means to said operator within said cavity and having a second portion integral with said first portion and engaging and actuating said contact means at a predetermined point in the path of travel of said operator, said cam means being interchangeable with other cam means having a comparably configured first portion whereby to afford preselection of the operator pre-switching-travel according to choice of a selectably configured second portion.

12. The invention defined in claim 11 wherein said operator is mounted to said housing for linear reciprocal sliding movement longitudinally thereof.

13. The invention defined in claim 12 further comprising coupling means adjustably mounting said first portion to said operator within said cavity for varying the longitudinal position of said cam means relative to said operator.

14. The invention defined in claim 13 wherein said coupling means comprises ribbed mating detent means formed on said first portion and said operator for multipositionally mounting said cam means to said operator.

15. The invention defined in claim 13 wherein said coupling means comprises a rotatable shaft journaled to said operator and extending longitudinally partially into said cavity to communicate with said first portion and having a threaded segment for varying the longitudinal position of said cam means relative to said operator along the axis of said shaft upon rotation thereof whereby to afford adjustment of the operator preswitching travel.

16. The improvement according to claim 1 wherein said insert is internal to the cross-sectional perimeter of the operator taken perpendicularly to the direction of operator travel, and wherein said contact mechanism has a movable actuating portion engaged by said camming surfaces of said insert during movement of the operator, said actuating portion extending partially into said cavity internally of said perimeter when the operator is in a first position and being cammingly depressed externally of said perimeter when the operator is in a second position.

17. The improvement according to claim 16 wherein the switch has a housing including guiding surfaces abutting said operator about at least a portion of said perimeter to guide the sliding movement of said operator and abutting said insert to retain said insert within said cavity internally of said perimeter.

18. The improvement according to claim 17 wherein said housing has a first section disposing said contact mechanism and a second section defined by said guiding surfaces and telescopically receiving said operator.

19. The improvement according to claim 18 wherein one of said guiding surfaces is a dividing partition wall between said first and second sections of said housing, said one guiding surface having an aperture through which said actuating portion of said contact mechanism extends into said cavity when said operator is in said first position.

20. The improvement according to claim 19 wherein said second section of said housing has a rectangular configuration with top, bottom, front and rear walls being said guiding surfaces, and a right side wall, said operator extending rightwardly into said second section from the left side thereof for left-right rectilinear reciprocal movement, said bottom wall being said one guiding surface serving also as said dividing partition wall between said first and second sections, said cam insert abutting said bottom wall and at least one of said front and rear walls.

* * * * *